(12) United States Patent
Haller et al.

(10) Patent No.: US 9,520,402 B1
(45) Date of Patent: Dec. 13, 2016

(54) PROVISION OF ETCH STOP FOR WORDLINES IN A MEMORY DEVICE

(71) Applicant: Intel Corporation, Santa Clara, CA (US)

(72) Inventors: Gordon A. Haller, Boise, ID (US); Jun Liu, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/835,648

(22) Filed: Aug. 25, 2015

(51) Int. Cl.
| | |
|---|---|
| *H01L 27/115* | (2006.01) |
| *H01L 23/528* | (2006.01) |
| *H01L 23/532* | (2006.01) |
| *H01L 21/768* | (2006.01) |
| *H01L 21/3205* | (2006.01) |

(52) U.S. Cl.
CPC ... *H01L 27/11551* (2013.01); *H01L 21/32053* (2013.01); *H01L 21/76886* (2013.01); *H01L 21/76889* (2013.01); *H01L 23/528* (2013.01); *H01L 23/53209* (2013.01); *H01L 23/53257* (2013.01); *H01L 27/11521* (2013.01); *H01L 27/11524* (2013.01); *H01L 27/11556* (2013.01); *H01L 27/11582* (2013.01)

(58) Field of Classification Search
CPC ............ H01L 27/11521; H01L 27/11524; H01L 27/11551
See application file for complete search history.

(56) References Cited

U.S. PATENT DOCUMENTS

| | | | | |
|---|---|---|---|---|
| 6,258,648 | B1* | 7/2001 | Lee | H01L 27/11526 257/E21.438 |
| 8,975,609 | B2* | 3/2015 | Gee | H01L 45/085 257/2 |
| 2005/0263824 | A1* | 12/2005 | Nakajima | H01L 21/823835 257/369 |
| 2009/0100388 | A1* | 4/2009 | Kemerer | H01L 29/945 716/106 |
| 2009/0230449 | A1* | 9/2009 | Sakaguchi | H01L 27/0688 257/298 |

(Continued)

OTHER PUBLICATIONS

International Search Report and Written Opinion mailed Oct. 20, 2016, issued in corresponding International Application No. PCT/US2016/043143, 14 pages.

*Primary Examiner* — Joseph C Nicely
(74) *Attorney, Agent, or Firm* — Schwabe, Williamson & Wyatt, P.C.

(57) ABSTRACT

Embodiments of the present disclosure are directed towards techniques to provide etch stops to the wordlines that form a staircase structure of a 3D memory array. In one embodiment, the apparatus may comprise a 3D memory array having wordlines disposed in a staircase structure. A wordline may include a silicide layer and a spacer disposed to abut the silicide layer around an end of the wordline. The silicide layer and the spacer may form an etch stop of the wordline for a wordline contact structure to electrically connect the wordline with the memory array in response to a deposition of the wordline contact structure on the etch stop. The etch stop may be configured to prevent a physical or electrical contact of the wordline contact structure with an adjacent wordline of the staircase structure, in order to avoid undesired short circuits. Other embodiments may be described and/or claimed.

17 Claims, 10 Drawing Sheets

(56) References Cited

U.S. PATENT DOCUMENTS

| | | | |
|---|---|---|---|
| 2009/0242967 A1* | 10/2009 | Katsumata | H01L 21/764 257/324 |
| 2010/0193861 A1* | 8/2010 | Shim | H01L 27/11551 257/329 |
| 2010/0207240 A1 | 8/2010 | Hashimoto et al. | |
| 2010/0232224 A1* | 9/2010 | Maeda | G11C 16/0483 365/185.18 |
| 2011/0031547 A1* | 2/2011 | Watanabe | H01L 27/11582 257/319 |
| 2011/0031630 A1* | 2/2011 | Hashimoto | H01L 27/11578 257/774 |
| 2012/0001249 A1* | 1/2012 | Alsmeier | H01L 27/11551 257/319 |
| 2012/0119283 A1* | 5/2012 | Lee | H01L 27/11519 257/316 |
| 2012/0119287 A1* | 5/2012 | Park | H01L 27/11519 257/329 |
| 2012/0238093 A1* | 9/2012 | Park | H01L 21/76838 438/675 |
| 2013/0005136 A1* | 1/2013 | Wells | H01L 21/28518 438/622 |
| 2013/0056818 A1* | 3/2013 | Iino | H01L 27/1157 257/324 |
| 2013/0161731 A1* | 6/2013 | Bin | H01L 29/78 257/329 |
| 2013/0334589 A1* | 12/2013 | Ahn | H01L 29/7926 257/324 |
| 2014/0054789 A1 | 2/2014 | Chiu et al. | |
| 2014/0327093 A1* | 11/2014 | Lo | H01L 21/28088 257/410 |
| 2015/0221667 A1 | 8/2015 | Fukuzumi et al. | |
| 2016/0005759 A1* | 1/2016 | Kim | H01L 27/11582 257/314 |
| 2016/0064041 A1* | 3/2016 | Okada | H01L 27/11582 365/51 |
| 2016/0071861 A1* | 3/2016 | Serov | H01L 27/11556 365/185.19 |
| 2016/0071876 A1* | 3/2016 | Mizuno | H01L 21/28282 365/185.17 |
| 2016/0086964 A1* | 3/2016 | Chien | H01L 27/11556 257/314 |
| 2016/0111438 A1* | 4/2016 | Tsutsumi | H01L 27/11582 257/314 |
| 2016/0126248 A1* | 5/2016 | Rabkin | H01L 27/11524 257/321 |
| 2016/0133630 A1* | 5/2016 | Kim | H01L 27/1052 438/631 |

* cited by examiner

PROVISION OF ETCH STOP FOR WORDLINES IN A MEMORY DEVICE

FIELD

Embodiments of the present disclosure generally relate to the field of integrated circuits (IC), and more particularly, to fabrication techniques for a three-dimensional memory device.

BACKGROUND

A typical flash memory device may comprise a memory array that includes a large number of non-volatile memory cells arranged in row and column fashion. In recent years, vertical memory, such as three-dimensional (3D) memory has been developed. A 3D flash memory (e.g., 3D NAND memory array) device may include a plurality of strings of charge storage devices (memory cells) stacked over one another. Each group of the plurality of strings may share a plurality of access lines, known as wordlines (WLs). Each of the plurality of access lines may couple (e.g., electrically connect via provided contacts) the charge storage devices (memory cells) corresponding to a respective tier of each string.

In a 3D memory device fabrication, the wordline contacts may be formed simultaneously with a single etch even though the contact landings may be at different latitude. However, it may be challenging to ensure during the etch process that the formed contact stops on a designated wordline, without leaking to another wordline (e.g., by punching through the designated wordline or leaking to the wordline underneath) and thus creating an undesired short circuit.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations for an apparatus comprising a memory array, in which etch stops are provided to the wordlines that form a staircase structure, in accordance with some embodiments. In some embodiments, an apparatus may comprise a memory array having a plurality of wordlines disposed in a staircase structure in a die. A wordline of the plurality of wordlines may include a silicide layer and, in some embodiments, a spacer disposed to abut the silicide layer around an end of the wordline. The silicide layer and the spacer may form an etch stop of the wordline for a wordline contact structure to electrically connect the wordline with the memory array in response to a deposition of the wordline contact structure on the etch stop. The etch stop may be configured to prevent a physical or electrical contact of the wordline contact structure with an adjacent wordline of the staircase structure, in order to avoid undesired short circuits.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

Figure 1:
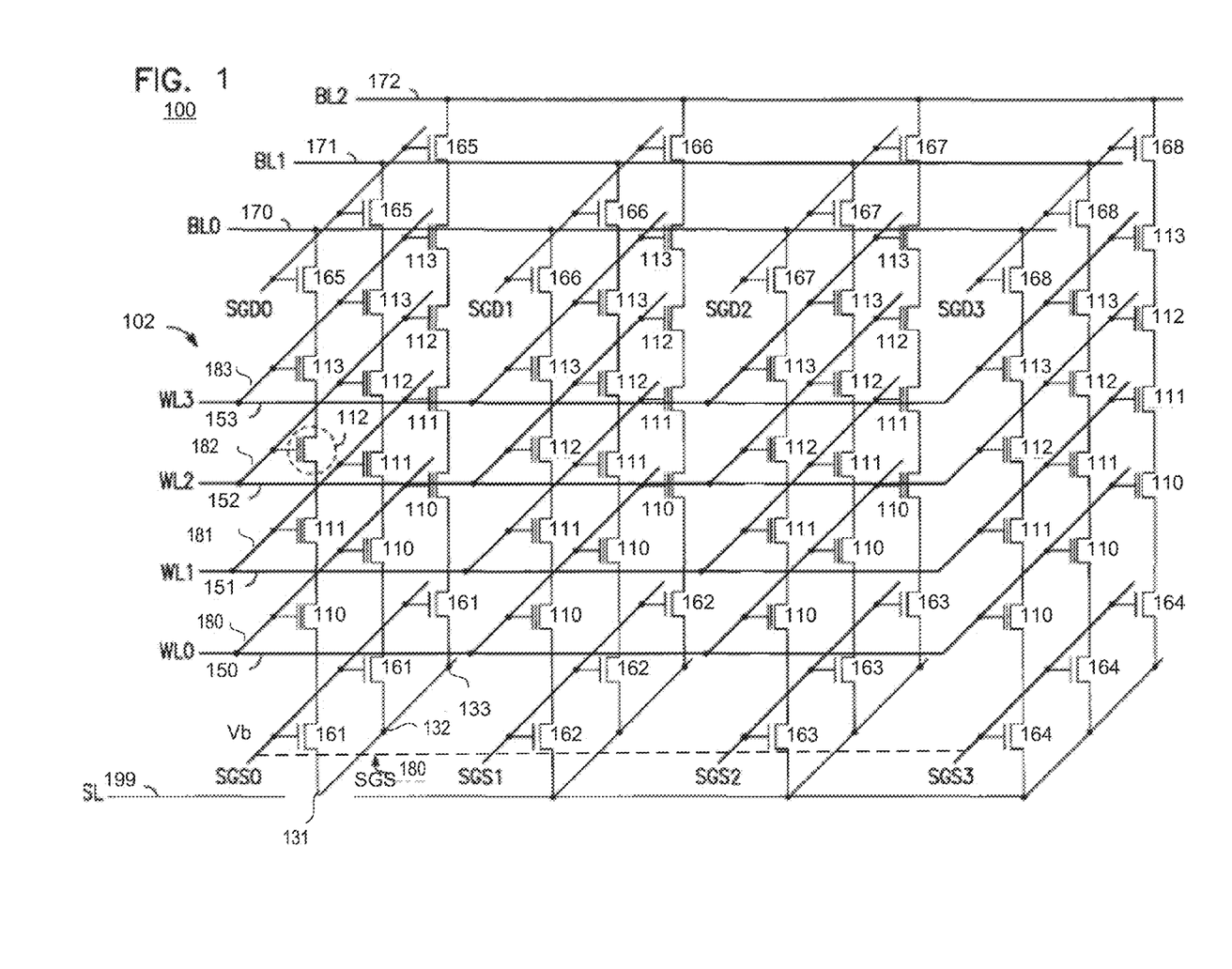
FIG. 1 is an example memory device comprising a 3D memory array fabricated with the wordline etch stop provision technique of the present disclosure, in accordance with some embodiments.

FIG. 1 is an example apparatus comprising a memory device 100 with a 3D memory array 102 fabricated with the wordline etch stop provision technique of the present disclosure, in accordance with some embodiments. Memory device 100 may include lines (e.g., wordlines) 150, 151, 152, and 153 that may carry corresponding signals WL0, WL1, WL2, and WL3, and may form at least part of access lines of memory device 100. Memory device 100 may include data lines (bitlines) 170, 171, and 172 that carry signals BL0, BL1, and BL2, respectively. Memory device 100 may include memory cells 110, 111, 112, and 113, and transistors 161 through 168. These memory cells 110, 111, 112, and 113 and transistors 161 through 168 may be arranged in memory cell strings, such as memory cell strings (pillars) 131, 132, and 133.

The example memory array 102 shown in FIG. 1 is provided for illustrative purposes and is not limiting to this disclosure. One skilled in the art will appreciate that the number of access lines, number of memory cell strings (pillars), number of contact lines, and number of memory cells in each memory cell string may vary.

Memory cells 110, 111, 112, and 113 may be physically located in multiple levels of memory device 100, such that memory cells 110, 111, 112, and 113 in the same memory cell string may be stacked over each other in multiple levels of memory device 100, forming a pillar. As shown in FIG. 1, transistors 161 through 168 and may be controlled (e.g., turned on or turned off) by corresponding signals SGD0, SGD1, SGD2, and SGD3, and SGS0, SGS1, SGS2, and SGS3 (connected via a common SGS line), provided via corresponding lines to couple the memory cell strings to their respective bitlines 170, 171, and 172, and a common source line 199 (carrying signal SL), during a memory operation. In some embodiments, the lines carrying signals SGS0, SGS1, SGS2, and SGS3 may be 180.

In a memory operation, different voltages may be applied to wordlines 150, 151, 152, and 153 to selectively access memory cells 110, 111, 112, and 113 in order to store information into one or more selected memory cell among memory cells 110, 111, 112, and 113. For example, in a write operation, memory device 100 may select memory cell 112 (shown within a dashed circle) of memory cell string 131 to store information into memory cell 112. In this example, memory device 100 may apply a voltage to wordline 152 and other voltages to wordlines 150, 151, and 153.

In embodiments, the memory array 102 may be disposed in a die, such as a NAND die, for example. To enable cell selection, the wordlines 150, 151, 152, 153 may be connected with memory cells (e.g., 110, 111, 112, 113) via interconnects, including respective contacts (contact structures) 180, 181, 182, 183, that provide electrical connectivity through the layers of the die as described below in greater detail. In some embodiments, the wordlines 150, 151, 152, 153 may be physically arranged in a staircase structure in the die. In a staircase structure, each wordline may extend beyond an end of the adjacent wordline, to enable contact (e.g., 180, 181, 182 or 183) provision to the respective wordline during fabrication process. For example, a contact structure may be disposed around an end of the wordline that extends beyond the adjacent wordline. The end of a wordline may be configured to provide an etch stop for the respective contact, to enable desired electrical connectivity with the wordline and to avoid undesired short circuits with other (e.g., adjacent) wordlines. The provision of an etch stop to a wordline of a plurality of wordlines arranged in a staircase structure is described below in reference to FIGS. 2-10.

FIGS. 2-8 schematically illustrate example cross-section side views of a wordline staircase structure of a 3D memory device, showing different stages of forming etch stops on wordlines arranged in a staircase structure in a die, in accordance with some embodiments. It will be understood that various features of a 3D memory device, e.g., electrical routing features, interconnect structures, and the like, that may be formed in the 3D memory device manufacturing process, are not shown in FIGS. 2-8 for simplicity.

Figure 2:
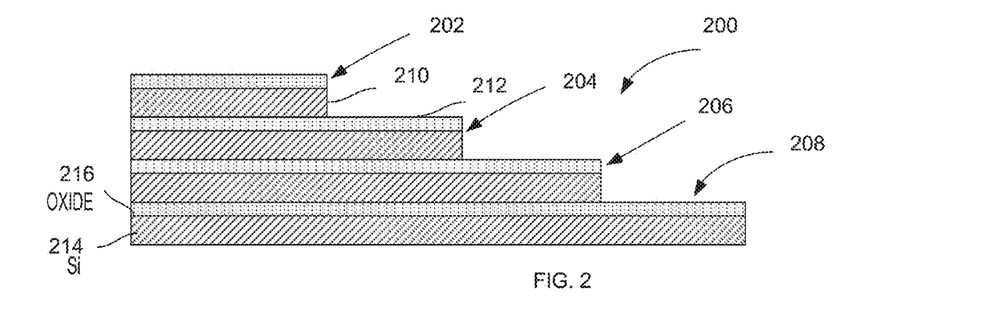
FIGS. 2-8 schematically illustrate example cross-section side views of a wordline staircase structure of a 3D memory device, showing different stages of forming etch stops on wordlines arranged in a staircase structure in a die, in accordance with some embodiments.

Referring to FIG. 2, the staircase structure 200 is depicted subsequent to forming a plurality of wordlines 202, 204, 206, 208 in the staircase structure. Only four wordlines of the plurality of wordlines are depicted in FIGS. 2-8 for simplicity purposes. As shown, the staircase structure 204 may include at least two wordlines (e.g., 202, 204) disposed adjacent to each other in response to an etch process employed for fabrication of the structure 200. As shown, a wordline (e.g., 204) extends beyond an end 210 of the adjacent wordline (e.g., 202) disposed above the wordline 204, forming a stair 212, on which an etch stop for a contact structure may be formed as described below. Each wordline may comprise a semiconductor layer 214 (e.g., silicon) and a passivation layer 216 (e.g., oxide) to separate the wordline from an adjacent wordline. For simplicity purposes, the numerals depicting components of each wordline of the staircase structure 200 (e.g., semiconductor layer 214, passivation layer 216, and the like) are shown in FIGS. 2-8 on one example wordline (e.g., 208).

Figure 3:
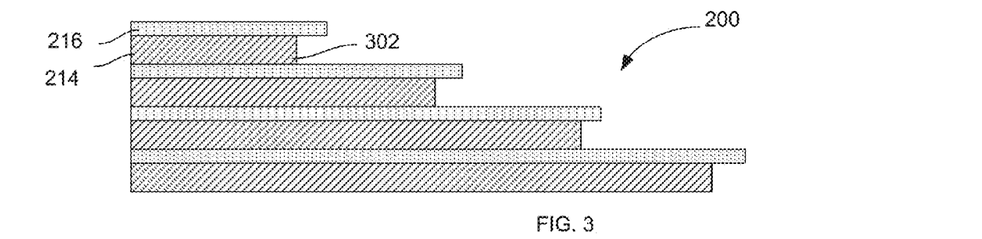

In FIG. 3, the staircase structure 200 is depicted subsequent to recessing the semiconductor layers 214 of the wordlines 202, 204, 206, 208, e.g., by wet etching the semiconductor material comprising the layers 214. The recess formed by the wet etching process is indicated by numeral 302. In embodiments, the recess 302 may comprise about 30 nm in length.

Figure 4:
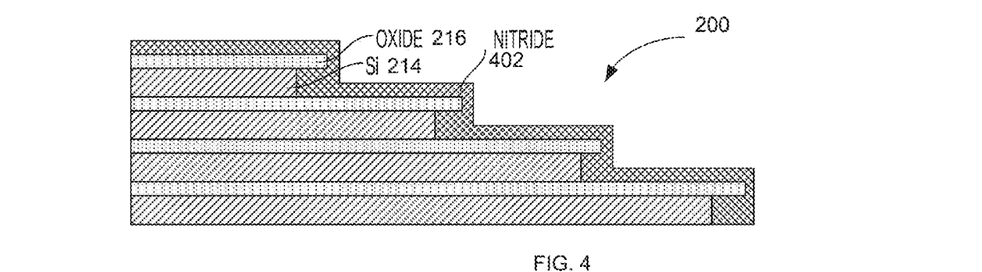

In FIG. 4, the staircase structure 200 is depicted subsequent to depositing an insulative dielectric material 402 on top of the stairs of wordlines 202, 204, 206, 208 of the staircase structure 200, to fill the recess 302. In embodiments, the deposited insulative dielectric material may have a thickness of about 15 nm.

As will be described below, a spacer for an etch stop of the wordline may be formed from the deposited insulated dielectric material 402. The insulative dielectric material 402 may be, for example, nitride or any other insulative dielectric material that may be deposited conformably on top of the passivation layer 216 and that may provide selectivity to oxide removal, and providing for absence of chemical reaction with the silicidation metal material used to provide the etch stop of the wordline as described below.

Selectivity to oxide provided by the insulative dielectric material 402 may be important since the spacer etch described below may remove the dielectric on top of the passivation (oxide) layer, stopping on the passivation layer, without affecting tier silicon (semiconductor) layer below. Following spacer etch, the oxide on tier silicon may be removed by oxide wet etch. Selectivity may also be desired so that the spacer dielectric may not be removed during the oxide removal In FIG. 5, the staircase structure 200 is depicted subsequent to resist patterning to remove the insulative dielectric material from the passivation layer 216, to form a spacer 502. The resist patterning may include etching of the insulative dielectric material 402, stopping on the passivation layer 216 of each wordline, to form the spacer 502. By this process, the spacer 502 may be self-aligned with the respective wordline 202.

Figure 5:
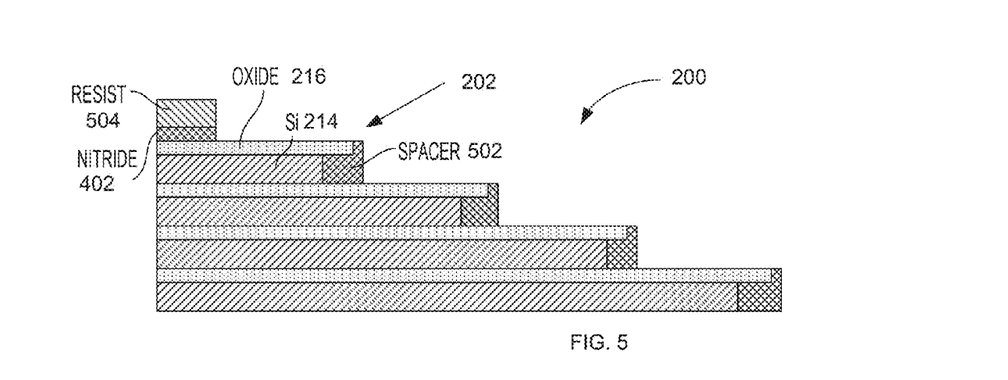

As shown, a resist layer 504 may be formed (e.g., by lithography) on top of the wordline 202 (e.g., top wordline of the staircase structure 200) to protect the wordline 202 from silicidation described below. Resist layer 504 may comprise a polymer and other substances (e.g. photoacid generators) that have been specially formulated for a given lithography technology.

Figure 6:
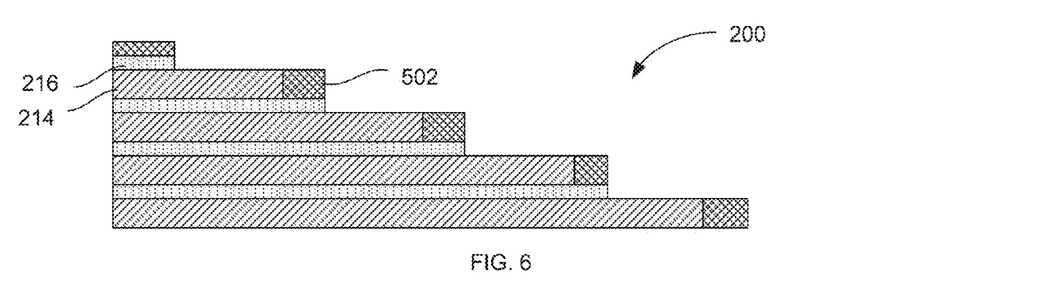

In FIG. 6, the staircase structure 200 is depicted subsequent to removing (e.g., wet stripping) the passivation layer 214 from the surface of the wordlines of the staircase structure 200, to expose the surface of the semiconductor layer 214 for further silicidation described below. The resist layer 504 may be stripped off by a wet or dry resist strip process, prior to removing the passivation layer 214.

Figure 7:
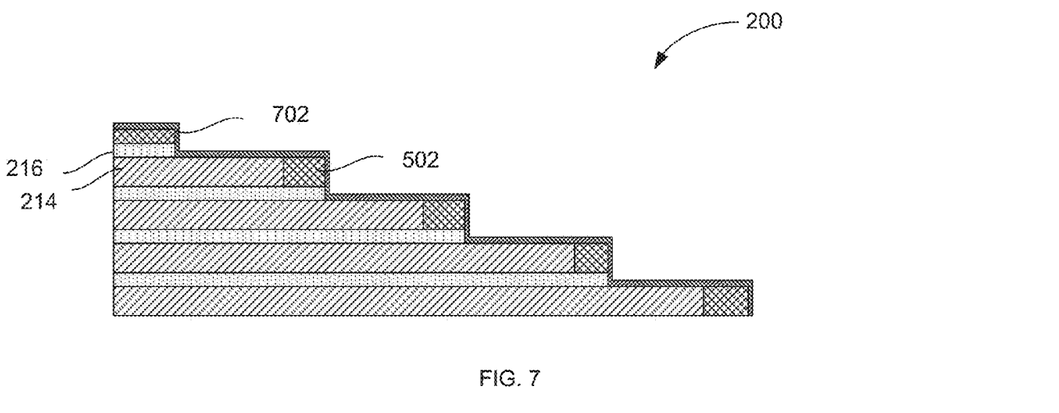

In FIG. 7, the staircase structure 200 is depicted subsequent to depositing a silicidation metal material layer 702 on top of the semiconductor layer 214 of the wordlines 202, 204, 206, 208. In embodiments, the silicidation metal material may include, but is not limited to, magnesium, platinum, titanium, cobalt, or the like. In embodiments, the silicidation metal material, e.g., cobalt, may be deposited in combination with titanium nitride. Titanium nitride may serve as a cap layer to prevent metal (e.g., cobalt) erosion.

Figure 8:
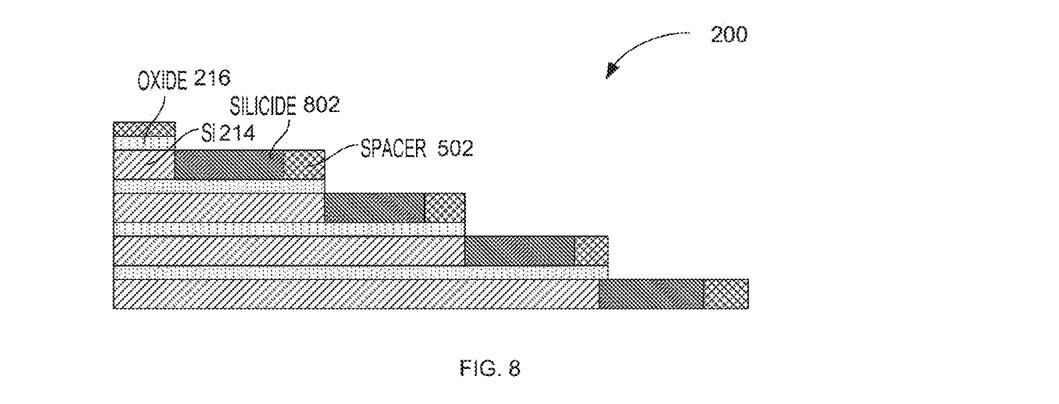

In FIG. 8, the staircase structure 200 is depicted subsequent to silicidation of the deposited metal material 702 based on the semiconductor layer 214 (silicon). Silicidation may include annealing of the metal material 702 and semiconductor layer 214 to form a corresponding silicide component, for example CoSi, and to convert the silicide component into another corresponding silicide, for example, $CoSi_2$, to form a silicide layer 802.

As a result of the process described in FIGS. 2-8, the silicide layer 802 may be formed that comprises a silicidation metal material compounded with silicon. As shown the silicide layer 802 may be disposed to abut the spacer 502 around an end of each wordline of the staircase structure 200. The silicide layer 702 and the spacer 502 may form an etch stop of the wordline for a wordline contact structure to electrically connect the wordline with the memory array in response to a deposition of the wordline contact structure on the etch stop, as described below in greater detail. When the short circuit occurs, wordline contact may not necessarily physically get in touch with adjacent wordline. In some instances, e.g., when the inter-wordline oxide is thinned down by wordline contact etch, it may cause leaking of the wordline contact. Accordingly, the etch stop may be configured as described above to prevent a physical or electrical contact of the wordline contact structure with an adjacent wordline of the staircase structure.

FIGS. 12-15 are example images of cross-section views of a wordline staircase structure of a 3D memory device, showing different stages of forming etch stops with silicidation, in accordance with some embodiments.

Figure 12:
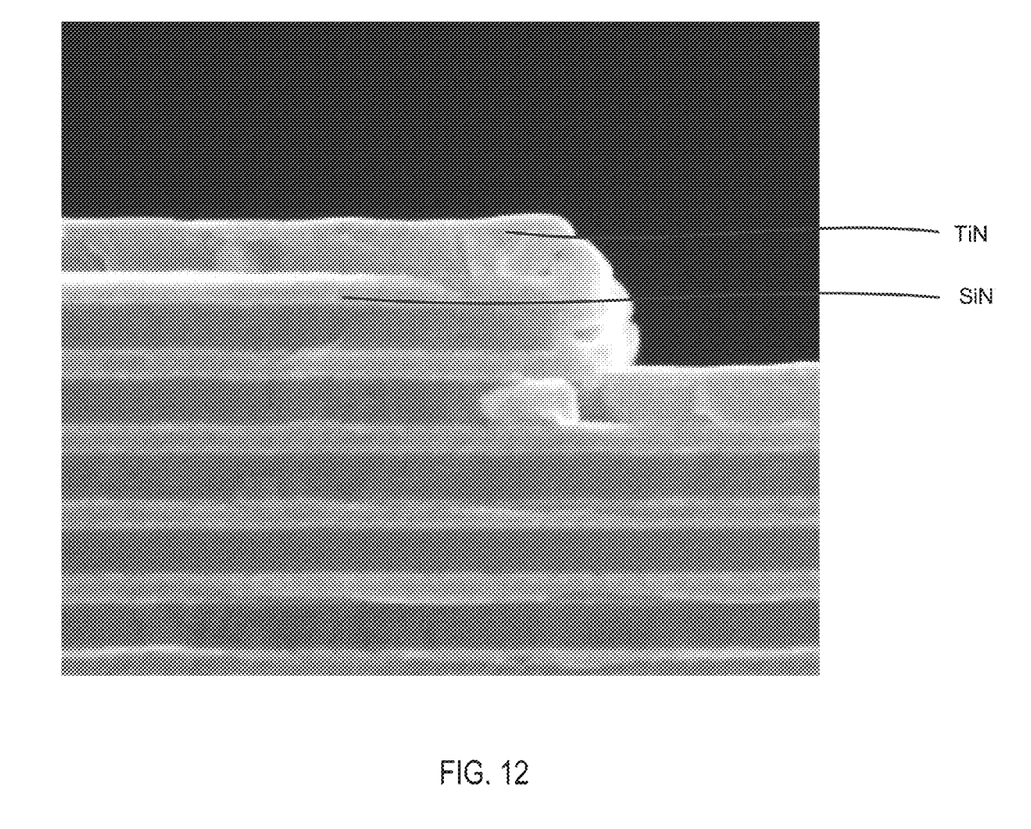
FIGS. 12-15 are example images of a cross-section views of a wordline staircase structure of a 3D memory device, showing different stages of forming etch stops with silicidation, in accordance with some embodiments.
Figure 13:
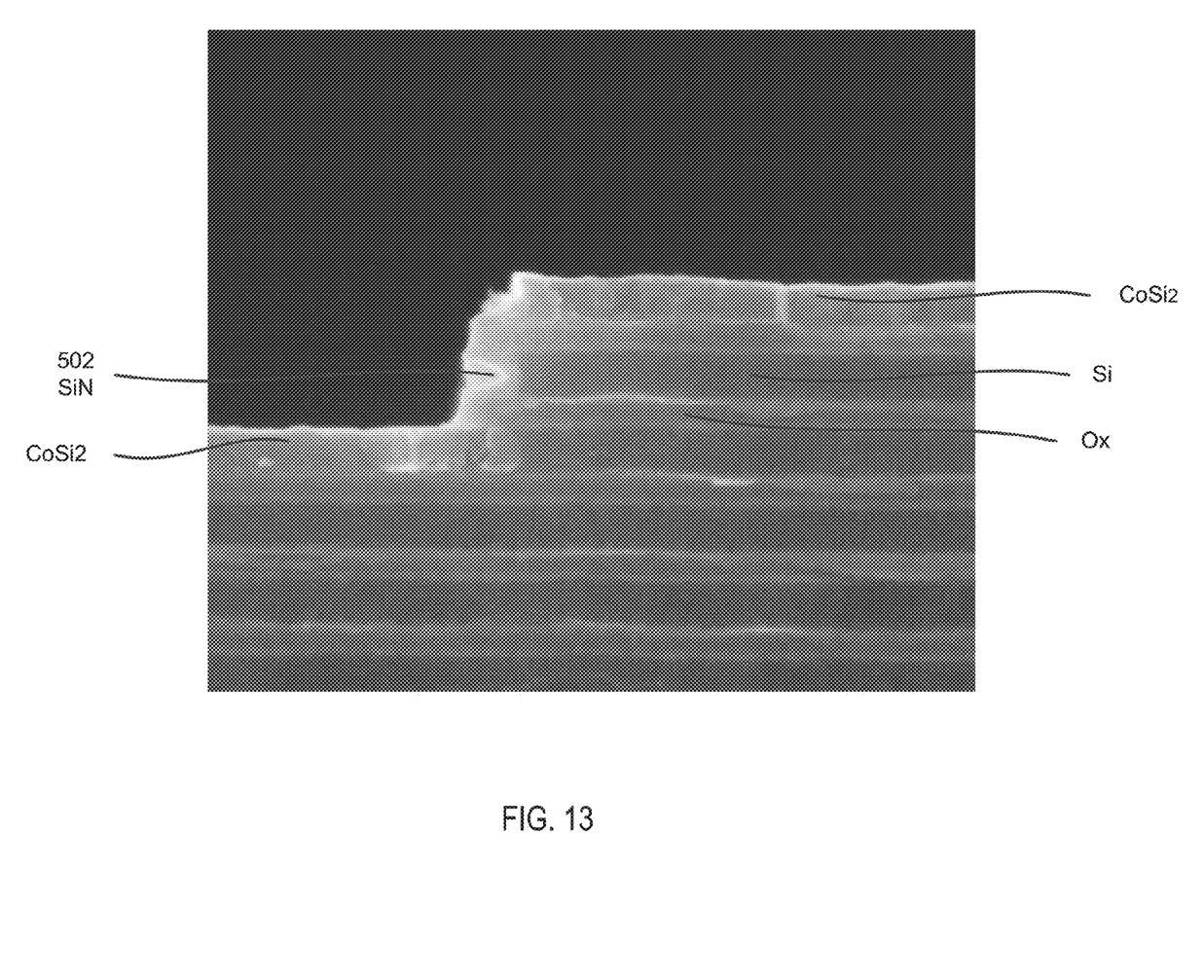
Figure 14:
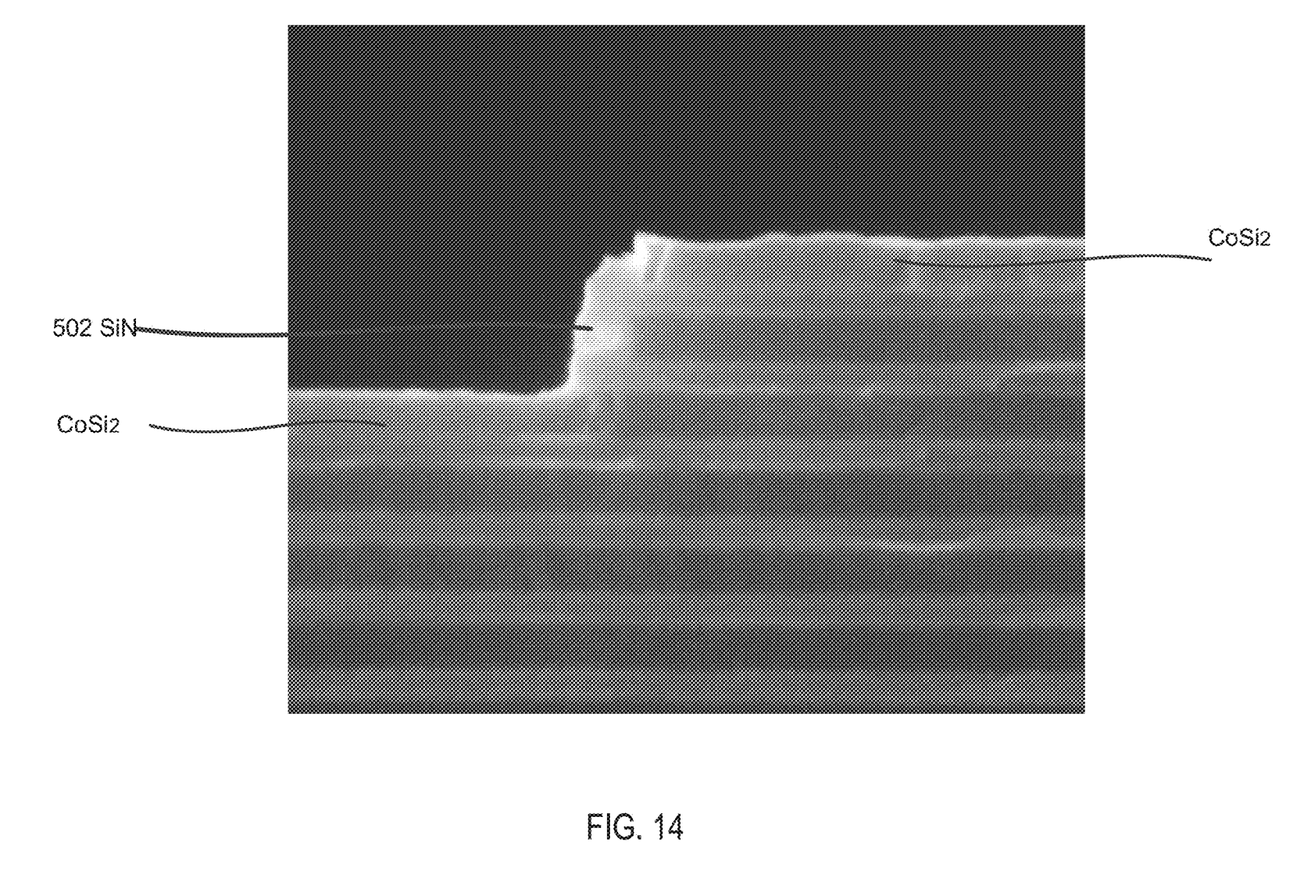

More specifically, FIGS. 12-14 illustrate full staircase $CoSi_2$ silicidation with self-aligned spacer, described in reference to FIGS. 2-8, in accordance with some embodiments.

FIG. 12 is an example image of the staircase structure showing silicide layers (TiN and SiN), without TiN wet strip. FIG. 13 is an example image of the staircase structure showing silicide layers, including spacer 502 clearly visible, with TiN wet strip. FIGS. 12-13 correspond to the stages of forming etch stops on wordlines arranged in a staircase structure described in reference to FIG. 7.

FIG. 14 is an example image of the staircase structure with nitride spacer 502 (SiN) clearly visible. FIG. 14 corresponds to the stages of forming etch stops on wordlines arranged in a staircase structure described in reference to FIG. 8.

The staircase structure 200 depicted in FIGS. 2-8 is shown as having one wordline per step. However, in some instances, the staircase structure may include two or more wordlines per step, as illustrated in the example image of FIG. 15.

Figure 15:
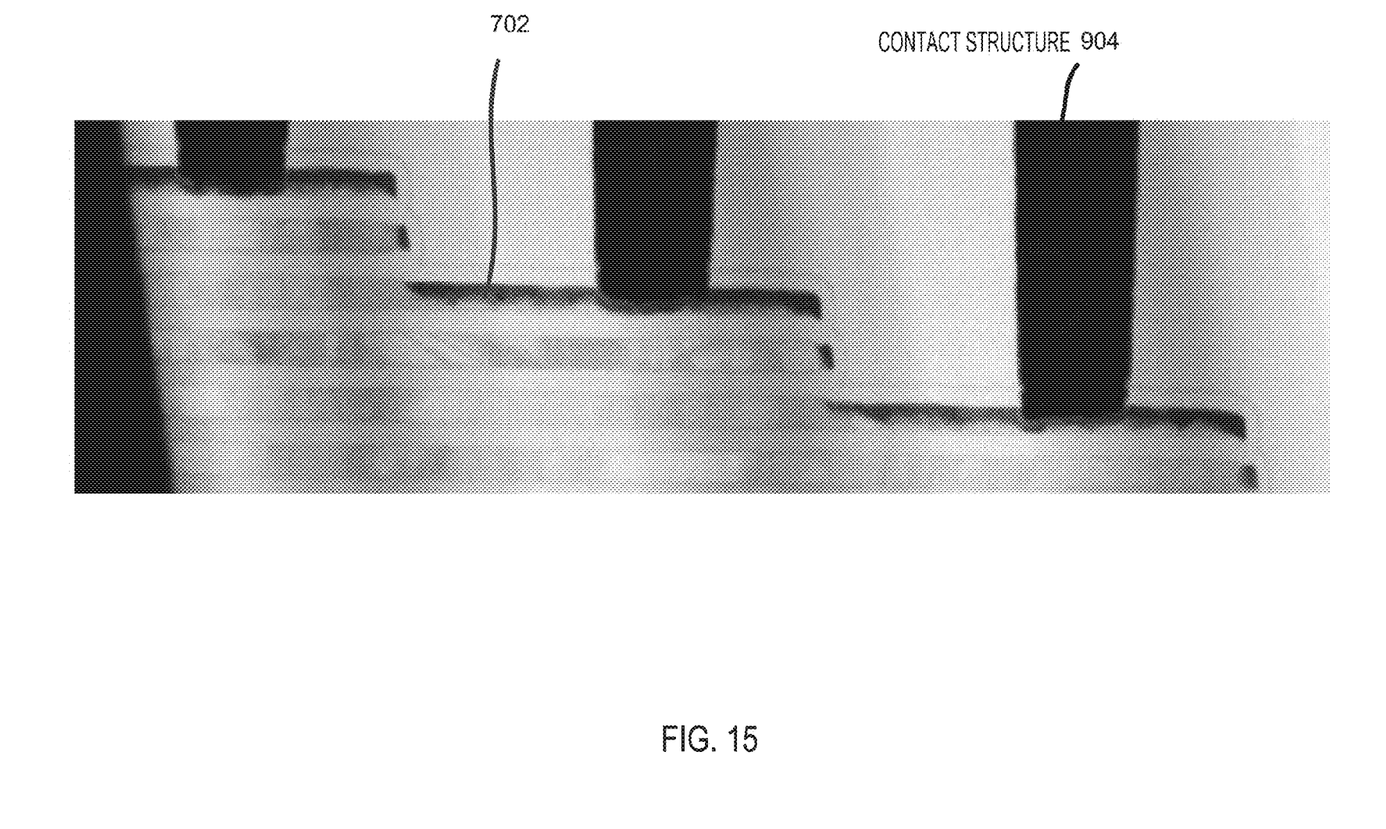

FIG. 15 is an example image of a cross-section view of the staircase with multiple wordline per step and etch stop with silicidation provided as described in reference to FIGS. 2-8, in accordance with some embodiments. The silicidation described in reference to FIGS. 2-8 may be formed on the upper wordline of the two or more wordlines of the step, as seen in FIG. 15, to provide an etch stop for a contact structure 904 (described in greater detail in reference to FIG. 9). In some embodiments, particularly in the case of the staircase structure including two or more wordlines per step, the etch stop may include the silicide layer 702, without having to form the recess 302 and corresponding spacer 502.

Figure 9:
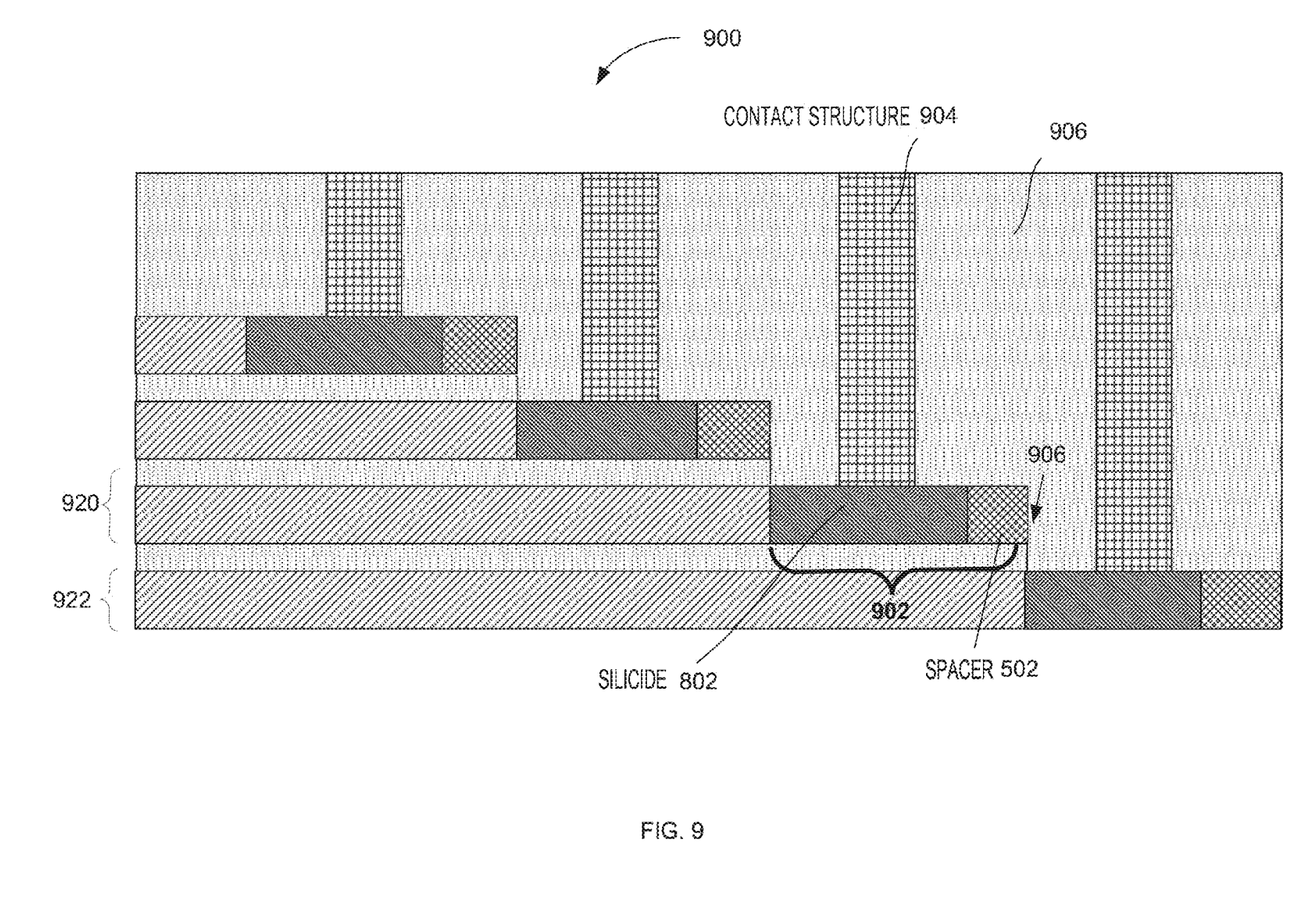
FIG. 9 illustrates an example cross-section side view of a wordline staircase structure of a 3D memory device with etch stops formed as described in reference to FIGS. 2-8, in accordance with some embodiments.

FIG. 9 illustrates an example cross-section side view of a wordline staircase structure 900 of a 3D memory device with etch stops formed as described in reference to FIGS. 2-8, in accordance with some embodiments. While the etch stop 902 of the wordline 920 and corresponding contact structure 904 are described herein, it will be understood that each wordline of the staircase structure 904 may have the etch stop and wordline structure as described in reference to the example wordline 920.

The etch stop 902 of the wordline 920 of the staircase structure 900 may be formed by the silicide layer 802 and the spacer 502, which abuts the silicide layer 802, as a result of etch stop formation described in reference to FIGS. 2-8. As shown, the wordline contact structure 904 may be formed on the etch stop 902, e.g., by a dry etch process, inside the dielectric layer 906 of the die, which may be composed of silicon dioxide. The wordline contact structure may provide electrical contact with the respective wordline and routing in subsequent levels (layers) of the die, and then to wordline driver and other circuitry in the substrate below or around the wordline staircase structure. The wordline contact structure 904 may comprise a metal, such as, for example, tungsten.

The proposed etch stop structure for the wordlines of a 3D memory array may provide a number of advantages. For example, the silicide layer 802 of the etch stop 902 may prevent the wordline contact structure 902 from punching through the wordline having the etch stop 902, during the dry etch process. Further, the spacer 502 of the etch stop 902 may prevent the wordline contact structure 902 from leaking over the end 906 of the wordline 920, formed by the spacer 502, to the adjacent wordline 922. Accordingly, undesirable short circuits between adjacent wordlines may be prevented.

Further, the proposed etch stop may provide desired stopping power due to employment of the silicide layer, compared to conventional structures (e.g., polysilicon based etch stops).

Further, the etch stop and contact formation process described in reference to FIGS. 2-9 may provide for full-thickness silicon conversion to silicide (described in reference to FIG. 8).

The described etch stop structure may provide for lower contact resistance (metal-to-metal) and wordline sheet resistance, compared to conventional polysilicon structures. Further, the contact formation may be made easier due to metal-to-metal contact between the wordline contact structure and the etch stop formed by the process described in reference to FIGS. 2-8. This advantage over conventional polysilicon structure may be achieved due to the fact that silicide layer may be formed on pristine amorphous silicon layer as a result of the process described in reference to FIGS. 7-8. Also, wet cleaning of the surfaces of the staircase structure before contact deposition may no longer be needed.

Further, the described etch stop structure provides for higher misalignment margin for contacts with staircase structure, due to the protection provided by spacers of etch stops.

Figure 10:
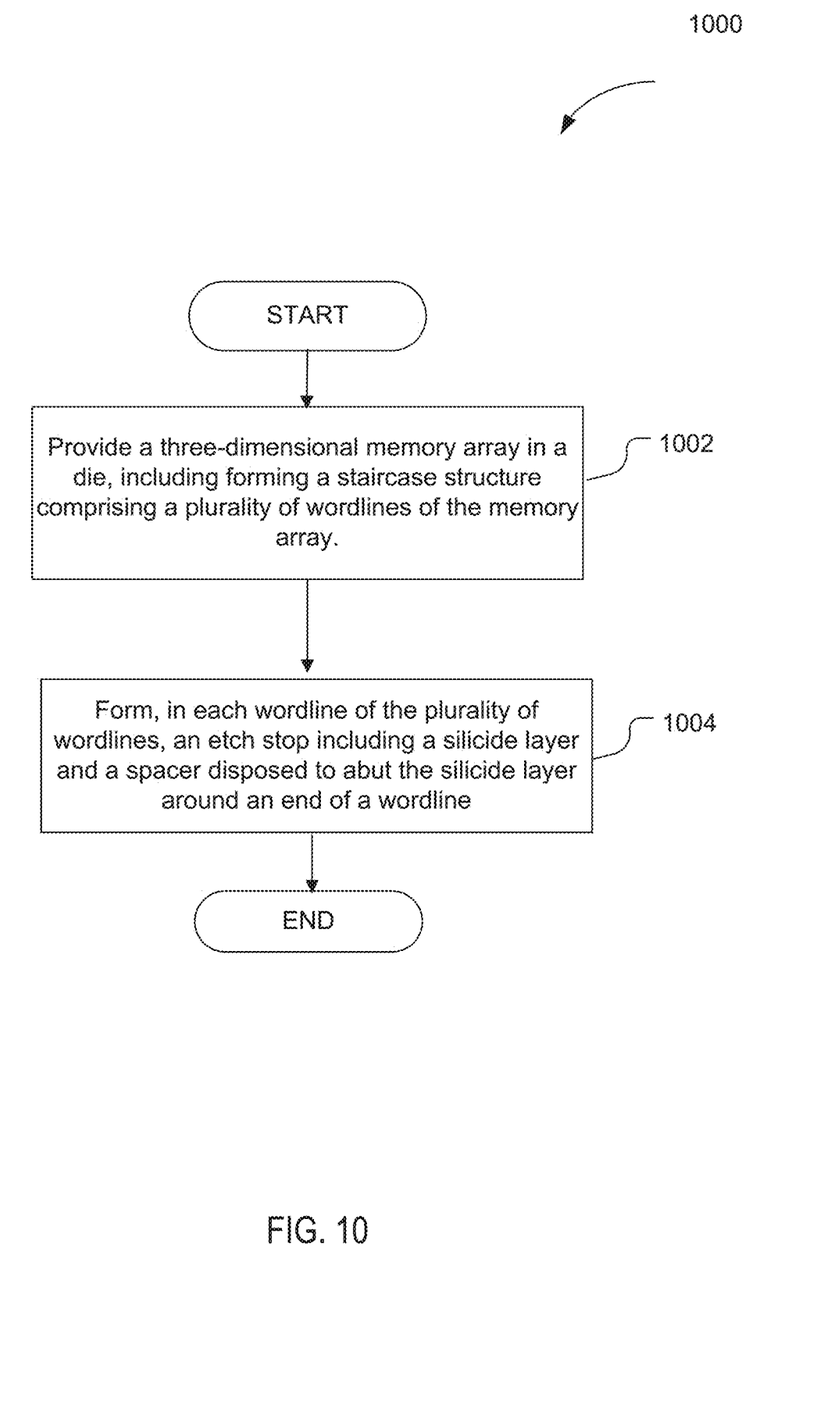
FIG. 10 is a process flow diagram for providing etch stops to wordlines of a 3D memory array, in accordance with some embodiments.

FIG. 10 is a process flow diagram for providing etch stops to wordlines of a 3D memory array, in accordance with some embodiments. The method 1000 may comport with actions described in connection with FIGS. 2-8 in some embodiments.

At block 1002, the method 1000 may include providing a three-dimensional memory array in a die, including forming a staircase structure comprising a plurality of wordlines of the memory array. Forming a staircase structure includes etching the staircase structure in a semiconductor material comprising the die, wherein etching includes forming each wordline with the semiconductor material and providing a passivation layer on top of the semiconductor material that forms a semiconductor layer of each wordline.

At block 1004, the method 1000 may further include forming, in each wordline of the plurality of wordlines, an etch stop including a silicide layer and a spacer disposed to abut the silicide layer around an end of a wordline. Forming an etch stop may include: recessing the semiconductor layer of the wordline; depositing an insulating dielectric material, to fill a recessed end of the semiconductor layer to form the spacer; removing excess of the insulating dielectric material and the passivation layer, to expose the semiconductor layer for silicidation; and forming a silicide layer, adjacent to the spacer, from the exposed semiconductor layer. Forming a silicide layer may include depositing a silicidation metal material on top of the semiconductor layer, and annealing the silicidation metal material and the semiconductor layer to form the silicide layer. The semiconductor material may comprise silicon. The silicide layer and the spacer may form the etch stop of the wordline.

Various operations of the method 1000 are described as multiple discrete operations, in a manner that is most helpful in understanding the claimed subject matter. However, the order of description should not be construed as to imply that these operations are necessarily order dependent. It will be appreciated that sequence of operations associated with method 700 may vary and/or include other actions in accordance with the present disclosure.

The memory arrays and methods described herein may be implemented into a system using any suitable hardware and/or software to configure as desired.

Figure 11:
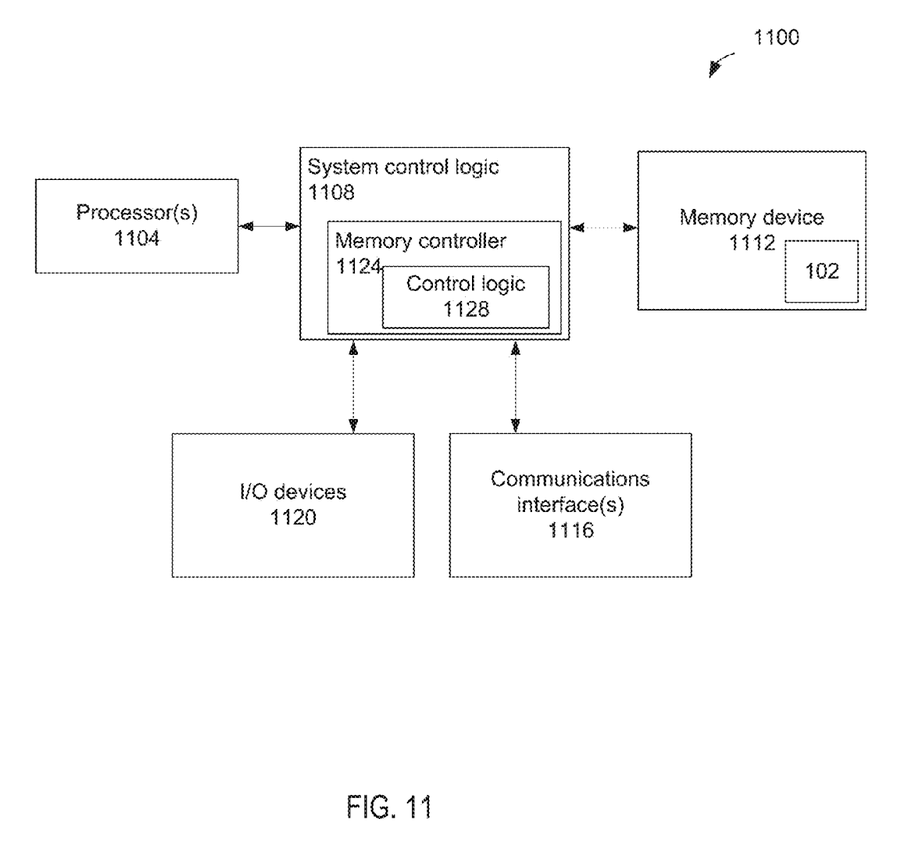
FIG. 11 schematically illustrates an example computing device including a memory array having etch stops provided to wordlines of the array using techniques of the present disclosure, in accordance with some embodiments.

FIG. 11 schematically illustrates an example computing device 1100 including a memory array having etch stops provided to wordlines of the array using techniques of the present disclosure, in accordance with some embodiments.

The computing device 1100 may include system control logic 1108 coupled to one or more processor(s) 1104; a memory device 1112 having a memory array; one or more communications interface(s) 1116; and input/output (I/O) devices 1120.

The memory device 1112 may be a non-volatile computer storage chip that may include the 3D memory device 100 with etch stops provided to wordlines, as described in reference to FIGS. 2-8. In addition to the memory array 102, the memory device 1112 may include a package, having the memory device 100 disposed therein, driver circuitry (e.g., drivers), input/output connections to electrically couple the memory device 1112 with other components of the computing device 1100, etc. The memory device 1112 may be configured to be removably or permanently coupled with the computing device 1100.

Communications interface(s) 1116 may provide an interface for computing device 1100 to communicate over one or more network(s) and/or with any other suitable device. Communications interface(s) 1116 may include any suitable hardware and/or firmware. Communications interface(s) 1116 for one embodiment may include, for example, a network adapter, a wireless network adapter, a telephone modem, and/or a wireless modem. For wireless communications, communications interface(s) 1116 for one embodiment may use one or more antennas to communicatively couple the computing device 1100 with a wireless network.

For one embodiment, at least one of the processor(s) 1104 may be packaged together with logic for one or more controller(s) of system control logic 1108. For one embodiment, at least one of the processor(s) 1104 may be packaged together with logic for one or more controllers of system control logic 1108 to form a System in Package (SiP). For one embodiment, at least one of the processor(s) 1104 may be integrated on the same die with logic for one or more controller(s) of system control logic 1108. For one embodiment, at least one of the processor(s) 1104 may be integrated on the same die with logic for one or more controller(s) of system control logic 1108 to form a System on Chip (SoC).

System control logic 1108 for one embodiment may include any suitable interface controllers to provide for any suitable interface to at least one of the processor(s) 1104 and/or to any suitable device or component in communication with system control logic 1108. The system control logic 1108 may move data into and/or out of the various components of the computing device 1100.

System control logic 1108 for one embodiment may include a memory controller 1124 to provide an interface to the memory device 1112 to control various memory access operations. The memory controller 1124 may include control logic 1128 that may be specifically configured to control access of the memory device 1112.

In various embodiments, the I/O devices 1120 may include user interfaces designed to enable user interaction with the computing device 1100, peripheral component interfaces designed to enable peripheral component interaction with the computing device 1100, and/or sensors designed to determine environmental conditions and/or location information related to the computing device 1100. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface.

In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 1116 to communicate with components of a positioning network, e.g., a global positioning system (GPS) satellite.

In various embodiments, the computing device 1100 may be a mobile computing device such as, but not limited to, a laptop computing device, a tablet computing device, a netbook, a smartphone, etc.; a desktop computing device; a workstation; a server; etc. The computing device 1100 may have more or less components, and/or different architectures. In further implementations, the computing device 1100 may be any other electronic device that processes data.

According to various embodiments, the present disclosure describes a number of examples.

Example 1 is an apparatus, comprising: a memory array having a plurality of wordlines disposed in a staircase structure in a die, wherein a wordline of the plurality of wordlines includes a silicide layer and, wherein the silicide layer forms an etch stop of the wordline for a wordline contact structure to electrically connect the wordline with the memory array in response to a deposition of the wordline contact structure on the etch stop, and to prevent a physical or electrical contact of the wordline contact structure with an adjacent wordline of the staircase structure.

Example 2 may include the subject matter of Example 1, wherein a plurality of wordlines disposed in a staircase structure include at least two wordlines disposed adjacent to each other in response to an etch process, wherein an etch stop of a first of the two wordlines extends beyond an end of a second of the two wordlines.

Example 3 may include the subject matter of Example 1, wherein the etch stop further includes a spacer disposed to abut the silicide layer around an end of the wordline, wherein the wordline further includes a semiconductor layer abutting the silicide layer of the etch stop, and a passivation layer to separate the wordline from an adjacent wordline, wherein the semiconductor layer and the etch stop are disposed on the passivation layer.

Example 4 may include the subject matter of Example 3, wherein the spacer comprises an insulative dielectric material, wherein the material includes a nitride.

Example 5 may include the subject matter of Example 4, wherein the silicide layer comprises a silicidation metal material compounded with silicon, wherein the insulative dielectric material of the spacer is free from a chemical reaction with the silicidation metal material.

Example 6 may include the subject matter of Example 5, wherein the silicide layer is one of: magnesium silicide, platinum silicide, titanium silicide, or cobalt silicide.

Example 7 may include the subject matter of Example 6, wherein the deposition of the wordline contact structure includes a formation of the structure by a dry etch process, wherein the etch stop is to prevent the wordline contact structure from a leak over the end of the wordline or from a penetration through the wordline to an adjacent wordline.

Example 8 may include the subject matter of Example 7, wherein the wordline contact structure comprises a metal, wherein the metal includes tungsten.

Example 9 may include the subject matter of any of Examples 1 to 8, wherein the memory array is a three-dimensional (3D) memory array.

Example 10 may include the subject matter of Example 9, wherein the apparatus comprises an integrated circuit.

Example 11 is an apparatus, comprising: a processor; and a memory coupled with the processor, wherein the memory includes a memory array having a plurality of wordlines disposed in a staircase structure in a die, wherein a wordline of the plurality of wordlines includes a silicide layer, wherein the silicide layer forms an etch stop of the wordline for a wordline contact structure to electrically connect the wordline with the memory array.

Example 12 may include the subject matter of Example 11, wherein a plurality of wordlines disposed in a staircase structure include at least two wordlines disposed adjacent to each other in response to an etch process, wherein an etch stop of a first of the two wordlines extends beyond an end of a second of the two wordlines.

Example 13 may include the subject matter of Example 11, wherein the etch stop further includes a spacer disposed to abut the silicide layer around an end of the wordline, wherein the wordline further includes a semiconductor layer abutting the silicide layer of the etch stop, and a passivation layer to separate the wordline from an adjacent wordline, wherein the semiconductor layer and the etch stop are disposed on the passivation layer.

Example 14 may include the subject matter of Example 13, wherein the spacer comprises an insulative dielectric material to provide selectivity to oxide removal, wherein the silicide layer comprises a silicidation metal material compounded with silicon, wherein the insulative dielectric material of the spacer is free from a chemical reaction with the silicidation metal material.

Example 15 may include the subject matter of Example 11, wherein the apparatus is a mobile computing device.

Example 16 may include the subject matter of any of Examples 11 to 15, wherein the memory array is a three-dimensional (3D) NAND memory array.

Example 17 is a method, comprising: providing a three-dimensional memory array in a die, including forming a staircase structure comprising a plurality of wordlines of the memory array; and forming, in each wordline of the plurality of wordlines, an etch stop including a silicide layer, the silicide layer forming an etch stop of a wordline for a wordline contact structure to electrically connect the wordline with a memory array in the die.

Example 18 may include the subject matter of Example 17, wherein forming a staircase structure includes etching the staircase structure in a semiconductor material comprising the die, wherein etching includes forming each wordline with the semiconductor material and providing a passivation layer on top of the semiconductor material that forms a semiconductor layer of each wordline.

Example 19 may include the subject matter of Example 18, wherein forming an etch stop includes forming a spacer disposed to abut the silicide layer around an end of the wordline, including: recessing the semiconductor layer of the wordline; depositing an insulating dielectric material, to fill a recessed end of the semiconductor layer to form the spacer; removing excess of the insulating dielectric material and the passivation layer, to expose the semiconductor layer for silicidation; and forming a silicide layer, adjacent to the spacer, from the exposed semiconductor layer; wherein the silicide layer and the spacer further form the etch stop of the wordline.

Example 20 may include the subject matter of Example 19, wherein forming a silicide layer includes: depositing a silicidation metal material on top of the semiconductor layer; and annealing the silicidation metal material and the semiconductor layer to form the silicide layer, wherein the semiconductor material comprises silicon.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus, comprising:
a memory array having a plurality of wordlines disposed in a staircase structure in a die, wherein the plurality of wordlines includes at least a first wordline, a second wordline disposed on top of the first wordline and a third wordline disposed substantially underneath the first wordline, wherein at least the first wordline includes a semiconductor layer disposed on the third wordline, and a silicide layer disposed on the third wordline to abut a vertical edge of the semiconductor layer, and to extend the first wordline on the third wordline beyond a vertical edge of the second wordline to form a stair of the staircase structure on the third wordline, wherein the silicide layer forms an etch stop of the first wordline for a wordline contact structure to electrically connect the first wordline with the memory array in response to a deposition of the wordline contact structure on the etch stop, and to prevent a physical or electrical contact of the wordline contact structure with the third wordline of the staircase structure, wherein the etch stop further includes a spacer disposed to abut the silicide layer around an end of the first wordline, wherein a top surface of the silicide layer, sidewalls of a passivation layer that separates the first wordline from the second wordline, and a space in between the first wordline and the second wordline are free from the spacer.

2. The apparatus of claim 1, wherein the third wordline further includes a passivation layer to separate the third wordline from the first wordline, wherein the semiconductor layer and the etch stop of the first wordline are disposed on the passivation layer of the third wordline.

3. The apparatus of claim 2, wherein the spacer comprises an insulative dielectric material, wherein the material includes a nitride.

4. The apparatus of claim 3, wherein the silicide layer comprises a silicidation metal material compounded with silicon, wherein the insulative dielectric material of the spacer is free from a chemical reaction with the silicidation metal material.

5. The apparatus of claim 4, wherein the silicide layer is one of: magnesium silicide, platinum silicide, titanium silicide, or cobalt silicide.

6. The apparatus of claim 5, wherein the deposition of the wordline contact structure includes a formation of the structure by a dry etch process, wherein the etch stop is to prevent the wordline contact structure from a leak over an end of the first wordline or from a penetration through the wordline to an adjacent wordline.

7. The apparatus of claim 6, wherein the wordline contact structure comprises a metal, wherein the metal includes tungsten.

8. The apparatus of claim 1, wherein the memory array is a three-dimensional (3D) memory array.

9. The apparatus of claim 8, wherein the apparatus comprises an integrated circuit.

10. An apparatus, comprising: a processor; and
a memory coupled with the processor, wherein the memory includes a memory array having a plurality of wordlines disposed in a staircase structure in a die, wherein the plurality of wordlines includes at least a first wordline and a second wordline disposed on top of the first wordline, wherein the first wordline includes a semiconductor layer and a silicide layer that abuts a first vertical edge of the semiconductor layer to extend the first wordline beyond a first vertical edge of the second wordline to form a stair of the staircase structure, wherein the silicide layer forms an etch stop of the first wordline for a wordline contact structure to electrically connect the first wordline with the memory array, wherein the etch stop further includes a spacer disposed to abut the silicide iayer around an end of the first wordline, wherein a top surface of the silicide layer, sidewalls of a passivation layer that separates the first wordline from the second wordline, and a space in between the first wordline and the second wordline are free from the spacer.

11. The apparatus of claim 10, wherein the spacer comprises an insulative dielectric material to provide selectivity to oxide removal, wherein the silicide layer comprises a silicidation meta material compounded with silicon, wherein the insulative dielectric material of the spacer is free from a chemical reaction with the silicidation metal material.

12. The apparatus of claim 10, wherein the apparatus is a mobile computing device.

13. The apparatus of claim 10, wherein the memory array is a three-dimensional (3D) NAND memory array.

14. A method, comprising:
forming a staircase structure comprising a plurality of wordlines of a memory array in a die, including providing a first wordline with a semiconductor layer and disposing a second wordline on top of the first wordline; and
providing, in the first wordline of the plurality of wordlines, a silicide layer that abuts a first vertical edge of the semiconductor layer to extend the first wordline beyond a first vertical edge of the second wordline to form a stair of the staircase structure, the silicide layer forming an etch stop of the first wordline for a wordline contact structure to electrically connect the first wordline with the memory array, wherein forming the etch stop includes disposing a spacer to abut the silicide layer around an end of the first wordline, wherein a top surface of the silicide layer, sidewalls of a passivation layer that separates the first wordline from the second wordline, and a space in between the first wordline and the second wordline are free from the spacer.

15. The method of claim 14, wherein forming a staircase structure includes etching the staircase structure in a semiconductor material comprising the die, wherein etching includes forming each wordline with the semiconductor material and providing a passivation layer on top of the semiconductor material that forms a semiconductor layer of each wordline.

16. The method of claim 14, wherein disposing a spacer includes:
- recessing the semiconductor layer of the first wordline:
  - depositing an insulating dielectric material, to fill a recessed end of the semiconductor layer to form the spacer;
- removing excess of the insulating dielectric material and the passivation layer, to expose the semiconductor layer for silicidation; and
- forming the silicide layer; adjacent to the spacer; from the exposed semiconductor layer.

17. The method of claim 16, wherein forming the silicide layer includes:
- depositing a silicidation metal material on top of the semiconductor layer; and
- annealing the silicidation metal material and the semiconductor layer to form the silicide layer, wherein the semiconductor material comprises silicon.

* * * * *

UNITED STATES PATENT AND TRADEMARK OFFICE
CERTIFICATE OF CORRECTION

| | | |
|---|---|---|
| PATENT NO. | : 9,520,402 B1 | Page 1 of 1 |
| APPLICATION NO. | : 14/835648 | |
| DATED | : December 13, 2016 | |
| INVENTOR(S) | : Gordon A. Haller et al. | |

It is certified that error appears in the above-identified patent and that said Letters Patent is hereby corrected as shown below:

In the Claims

Claim 10, Column 12:
Line 35 reads "layer," should read -- layer --

Signed and Sealed this
Eighteenth Day of April, 2017

Michelle K. Lee
*Director of the United States Patent and Trademark Office*